(12) United States Patent
Archer, III et al.

(10) Patent No.: US 7,973,544 B2
(45) Date of Patent: Jul. 5, 2011

(54) THERMAL MONITORING AND MANAGEMENT OF INTEGRATED CIRCUITS

(75) Inventors: Vance D. Archer, III, Greensboro, NC (US); Daniel P. Chesire, Winter Garden, FL (US); Warren K. Gladden, Macungie, PA (US); Seung H. Kang, San Diego, CA (US); Taeho Kook, Orlando, FL (US); Sailesh M. Merchant, Macungie, PA (US); Vivian Ryan, Hampton, NJ (US)

(73) Assignee: Agere Systems Inc., Allentown, PA (US)

( * ) Notice: Subject to any disclaimer, the term of this patent is extended or adjusted under 35 U.S.C. 154(b) by 244 days.

(21) Appl. No.: 12/194,706

(22) Filed: Aug. 20, 2008

(65) Prior Publication Data
US 2010/0045326 A1 Feb. 25, 2010

(51) Int. Cl.
*G01R 31/00* (2006.01)

(52) U.S. Cl. . 324/750.03; 438/18; 257/48; 257/E21.522
(58) Field of Classification Search ............... None
See application file for complete search history.

(56) References Cited

U.S. PATENT DOCUMENTS

| | | | | |
|---|---|---|---|---|
| 5,264,377 | A * | 11/1993 | Chesire et al. | 438/11 |
| 6,293,698 | B1 * | 9/2001 | Alvis | 374/164 |
| 2008/0185584 | A1 * | 8/2008 | Walter et al. | 257/48 |
| 2008/0206908 | A1 * | 8/2008 | Walter | 438/18 |

* cited by examiner

*Primary Examiner* — Minh N Tang (57) ABSTRACT

The invention, in one aspect, provides a semiconductor device (100), including transistors (105), dielectric layers (115, 120) located over the transistors (105), interconnects (122) formed within the dielectric layers (115, 120), and a test structure (130) located adjacent a hot-spot (125) of the semiconductor device (100) and configured to monitor a real-time operational parameter of at least one of the transistors (105) or interconnects (122).

20 Claims, 6 Drawing Sheets

THERMAL MONITORING AND MANAGEMENT OF INTEGRATED CIRCUITS

TECHNICAL FIELD

This invention relates to semiconductor devices and, more particularly, to methods and designs for monitoring, managing and improving the reliability of integrated circuits during operation.

BACKGROUND

As the level of semiconductor circuit integration continues to increase and the complexity of these circuits advances, circuit reliability is becoming more dependent upon an increasing number of factors. For example, aggregate current leakage and increases in circuit speed generate greater thermal loads, while the use of low-k dielectric materials and air gaps in the dielectric materials adversely impacts dissipation of this heat. Smaller device sizes, increased packing density, advanced packages that trap heat in upper metallization, and shrinking line widths contribute to performance and reliability concerns. With oxide scaling there is an increased ratio of aggregate off current ($I_{off}$) to active device switching current, ($I_{on}$). There are also an increased circuit complexity and a greater variability in conditions under which devices are operated.

Due to the foregoing factors it is becoming ever more difficult to use conventional techniques like accelerated testing to assess the long-term stability of integrated circuit devices. Changes in local device operating temperature, isolated thermomigration, consequent materials transformations, and the rate of electromigration can be underestimated, resulting in premature and unexpected parametric and functional device failure.

SUMMARY

One embodiment of the invention provides a semiconductor device, comprising transistors, dielectric layers located over the transistors, interconnects formed within the dielectric layers, and a test structure located adjacent a hot-spot of the semiconductor device and configured to monitor a real-time operational parameter of at least one of the transistors or interconnects.

Another embodiment provides a method of manufacturing an integrated circuit. This embodiment comprises forming transistors over a semiconductor substrate, forming dielectric layers over the transistors, forming interconnects within the dielectric layers, and placing at least one test structure within at least one of the dielectric layers and adjacent a hot-spot associated with an interconnect structure that is susceptible to high temperatures during real-time operation. The at least one test structure is configured to monitor a temperature, frequency change, or resistance change of the interconnect structure.

Yet another embodiment includes a method of monitoring an integrated circuit. This embodiment comprises monitoring a test circuit located adjacent a hot-spot of the integrated circuit during real-time operation of the integrated circuit. The test circuit is configured to produce a signal in response to a change in an operational parameter of at least one of a transistor or interconnect structure of the integrated circuit. The method further includes analyzing the signal to determine if a failure within the hot-spot has occurred or prospective failure will occur within a predetermined period of time and replacing the integrated circuit when the signal indicates the failure or prospective failure.

BRIEF DESCRIPTION OF THE DRAWINGS

For a more complete understanding of the present invention, reference is now made to the following descriptions taken in conjunction with the accompanying drawings, in which.

DETAILED DESCRIPTION

Figure 1:
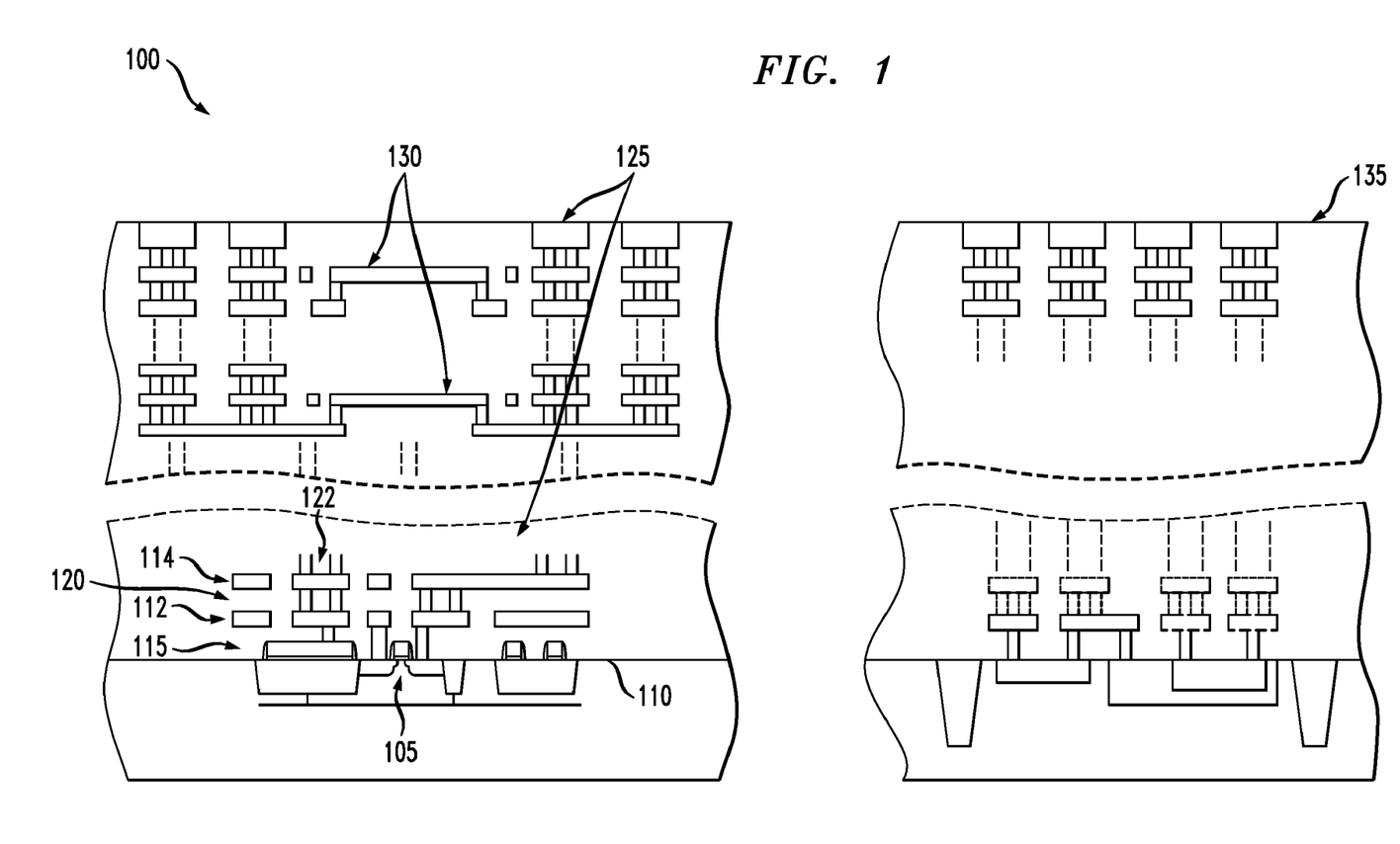
FIG. 1 illustrates a semiconductor device as provided by one embodiment of the invention.

FIG. 1 generally illustrates an integrated circuit (IC) 100 incorporating features of the invention. The IC 100 includes conventional transistor structures 105 that may include gates and source and drains located in a well located in a silicon substrate 110, which may include an epitaxially grown layer deposited over a mono-crystalline substrate material. The IC 100 further includes a series of metallization levels 112, 114 separated by layers of dielectric 115, 120 formed over the transistor structures 105. Depending on design and function, the IC 100 may have seven or more levels of metallization. In a typical embodiment, the dielectric layers 115, 120 have formed therein conventional interconnects 122 that may comprise one or more of metal runners or trace portions, or contact and via portions, that effect electrical connection between the various levels and transistor structures 105. The metallization levels 112, 114 may be formed by conventional processes and may be formed of any suitable material including aluminum, copper, or combinations thereof.

The transistor structures 105 and/or the metallization levels 112, 114 may form a hot-spot within the IC 100. As used herein, a hot-spot 125 is any localized area of the transistor structures 105 and/or the metallization levels 112, 114 that is subject to an increased rate of failure due to high current densities, which can result in voiding or electromigration. Additionally, it is a region that is functional or adjacent a functional attribute, such as an interconnect, such that during normal field operation of the device or integrated circuit 100, the hot-spot 125 is subject to potential changes that can adversely affect the reliability period of the IC 100. In hot-spot 125, high frequency operation of the circuitry can generate substantial heat, causing the region to have an elevated temperature relative to other portions of the IC 100.

To monitor hot-spots 125, the illustrated embodiment includes one or more test structures 130 that are located among and adjacent the various metallization levels 112, 114. Although two test structures 130 are illustrated, it should be understood that several test structures 130 may be formed in differing regions and among various different ones of the metallization levels 112, 114 of the integrated circuit 100. The test structures 130 are configured to provide real-time monitoring of operational parameters, such as current density, temperature, frequency, or resistance. As used herein, real-time means an IC that has been deployed in the field and is used in normal operation. Field-deployment, field operation, and normal operation mean, in reference to an integrated circuit product, the deployment or operation of a device (i) after testing of the type which occurs during and immediately after the manufacturing process and (ii) in an operating environment (as opposed to a test and evaluation environment) in which the device is placed. Often the device is placed in a single operating environment for the majority or entirety of its useful life.

The configuration or design of the test structure 130 may vary and will depend on the characteristic intended to be monitored. For example, the test structure 130 may be configured as an extrusion monitor, a temperature monitor, a frequency monitor, or a resistance monitor, any of which can indicate a real-time reliability of the IC 100. Useful reliability and performance information can be acquired by positioning these test structures 130 within, or in sufficient proximity to hot-spots 125 to indicate changes therein. In an associated method the expected reliability period of the IC 100 may be estimated by monitoring the value of at least one parameter associated with a feature in the hot-spots 125. Changes in the value of the parameter can be correlated with adverse changes in the hot-spots 125. By monitoring one or more parameters indicative of adverse changes in the hot-spots 125, estimates of the expected reliability period can be periodically assessed. Alternately, imminent or actual device failure may be determined.

FIG. 1 also illustrates an example of a test structure 130 configured as a temperature sensor circuitry that may be positioned adjacent the hot-spot 125. The test structure 130 may be present by itself or may be used in conjunction with a bipolar region 135, as shown.

Proximity of the test structure 130 to specific hot spots 125 can affect the calculations regarding the reliability of the IC 100 because of the temperature dependence of key failure mechanisms, such as electromigration and time dependent dielectric breakdown (TDDB), which also can affect resistance measurements and frequency changes. In order to identify the hot spots 125 and temperature gradients during normal operation, a finite element analysis method or an analytical method may be used. Temperature gradient information can be used to select tester locations and to estimate the temperature differences between the regions where these testers are placed and the hot spot. The measured temperature, e.g., determined with a thermal diode, in combination with the estimated thermal gradient, for example, based on modeling, are used to estimate the actual temperature of the feature of concern. In this sense, the location of the test structure 130 is predetermined at the time of manufacture.

Figure 2A:
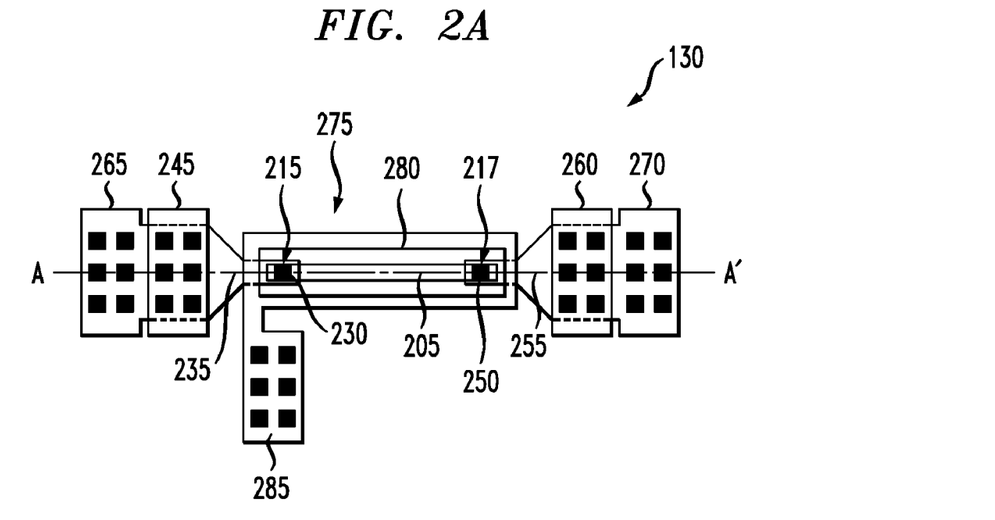
FIGS. 2A-2B illustrate an embodiment of a test structure that may be incorporated into an integrated circuit.
Figure 2B:
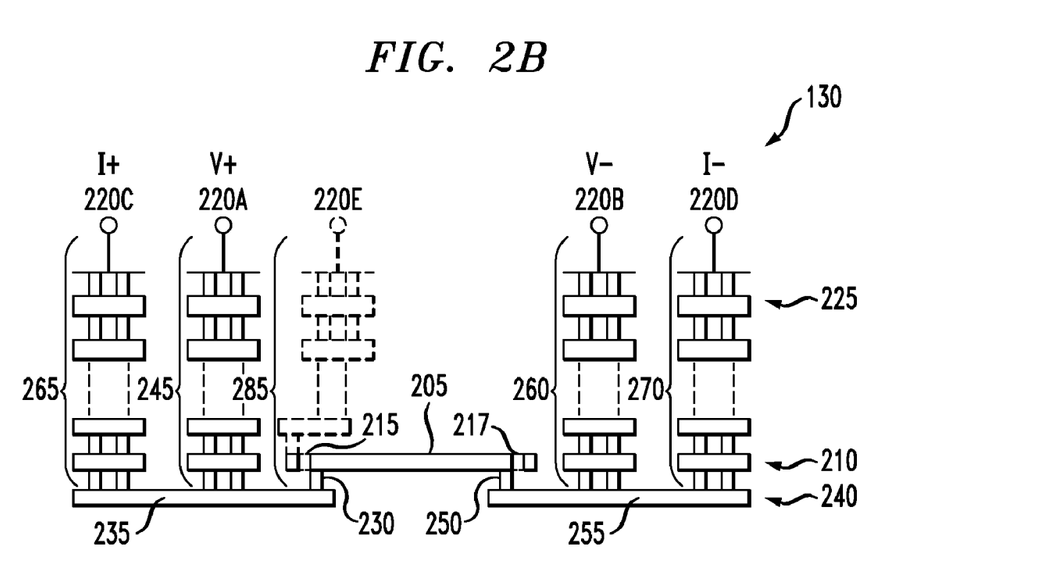

Referring next FIGS. 2A and 2B, an example of one of the test structures 130 of FIG. 1 is shown to include a test segment 205 of a metal runner formed in metallization levels 210 having first and second end portions 215 and 217. FIG. 2B, taken through line A-A', schematically illustrates a series of bond pad terminals 220A-220E formed on a metallization level 225. The bond pad terminals 220A-220E are connected to the end portions 215 and 217 of the runner 205 to assess the status of the test structure 130 with the processing circuitry illustrated in FIG. 3 during real-time operation of IC 100.

The runner segment 205 may be connected to numerous terminals through multiple structures of vias and landings formed in the overlying metallization levels 210, 225. In an example of one layout that may be employed, the first end portion 215 is connected to a V$^+$ terminal 220A through via 230, a runner segment 235 in metallization level 240, and a via structure 245. The second end portion 217 of the runner segment 205 is connected to a V$^-$ terminal 220B through a via 250, a runner segment 255 in metallization level 240 and a via structure 260 for voltage sensing. The runner segment 205 is also connected to an I$^+$ current supply terminal 220C and an I$^-$ current supply terminal 220D. The first end portion 215 of the runner segment 205 is connected to the positive current supply terminal I$^+$ through the via 230, the runner segment 235 and a via structure 265 formed in the overlying metallization levels 210, 225, and 240. The second end portion 217 is connected to the negative current supply terminal I$^-$ through the via 250, the runner segment 255 and a via structure 270 formed in the overlying metallization levels 210, 225, and 240. The test structure 130 may also include an extrusion monitor 275, including a closed shape metal runner element 280 in the metallization level 210 and surrounding the runner 205, shown illustratively in FIG. 2A. The spacing between the element 280 and the runner 205 may correspond to minimum spacing design rules of the process technology with which the IC 100 is fabricated. The closed shape metal runner element 280 of the extrusion monitor 275 is connected through a via structure 285 formed in the overlying metallization levels 210, 225 and 240 to an extrusion monitor terminal 220E to sense current change if the runner 205 undergoes sufficient extrusion to create a short with the monitor runner element 280. Although the bond pads 220A-220D are illustrated as positioned directly above the test structure 130 this is for purposes of illustration while the various bond pads may be routed to other regions of the IC 100. The bond pad 220E and associated series of vias and landings of the via structure 285 are shown in FIG. 2B with phantom lines because the vias and landings are in a different plane than that defined by the line A-A'. Various configurations and embodiments of the illustrative bond pad structures are also within the scope of the present disclosure.

The placement of the test structures are provided herein adjacent a hot-spot and within the IC 100 is counter-intuitive to conventional test structures for at least two reasons. First, such conventional test structures are employed in either in-line or end-of-line processing where the device is subjected to artificial operating conditions, and therefore, the IC and test structure are not configured to monitor real-time operation of the IC. Second, these conventional test structures are also not placed adjacent hot-spots within the IC itself, but are instead placed at the perimeter of the IC 100 or in the streets (saw grid, seal ring region, etc. of the wafer) to maximize utilization of component space.

Figure 3A:
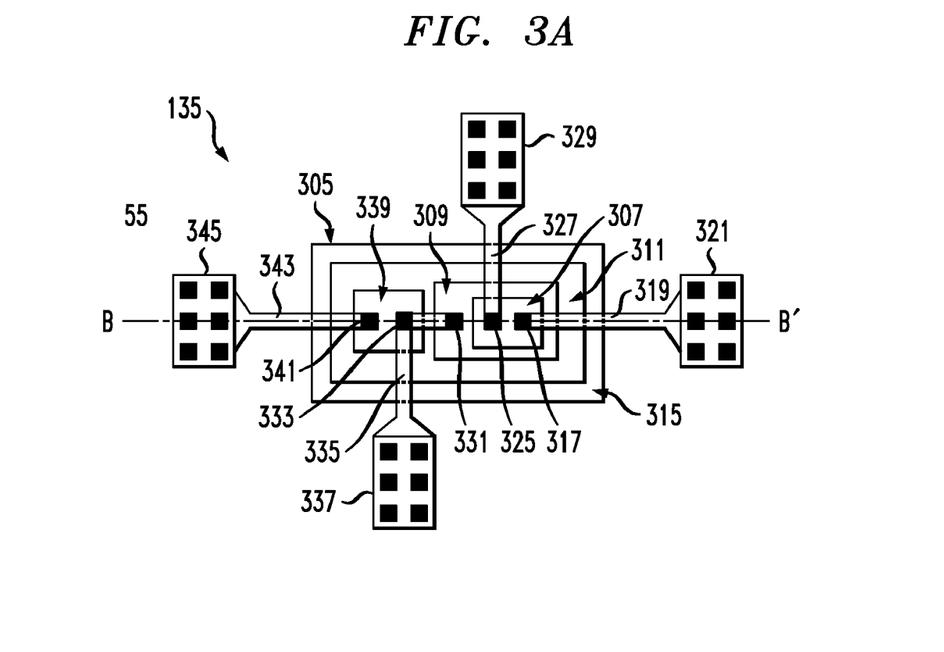
FIGS. 3A-3B illustrate an alternative embodiment of a test structure that may be incorporated into the integrated circuit.
Figure 3B:
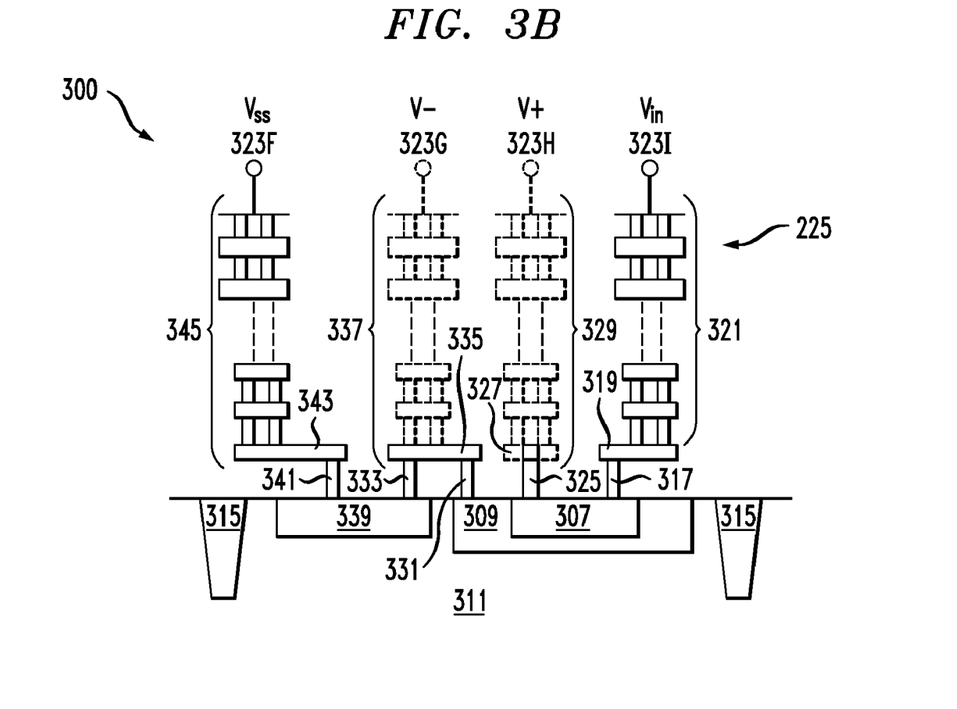

FIGS. 3A and 3B illustrate the temperature sensor circuitry 135 associated with a transistor 300, which in one embodiment may be configured as a bipolar transistor, as shown. FIG. 3B, as taken through line B-B' of FIG. 3A, schematically illustrates a series of bond pad terminals formed on an uppermost metallization level, to which temperature monitoring circuitry 135 is connected.

The ability to accurately and continually track thermal excursions of semiconductor circuitry locally and regionally is helpful in characterizing the product reliability of the IC of interest. In some operational modes the thermal variation within the device can depart substantially from design assumptions. Due to significant localized power densities, hot-spots may manifest in otherwise low power regions. An array of temperature monitoring circuits 135 can assist with identification of specific hot-spots of concern and enable real-time assessment of the reliability margin. This concept may, for example, be applied to estimations of time dependent dielectric breakdown (TDDB), negative bias temperature instability (NBTI) of p-type MOSFETs and electromigration effects, all of which are functions of operating temperature.

This concept may also be applied to sensing upcoming hard failures such as the onset of thermal run away or resistive metal fusing and to send signals that inform the system or operators to take appropriate action.

In FIGS. 3A and 3B, the temperature sensor circuitry 135 includes a bipolar transistor 305 wired as a diode. As illustrated in FIG. 3A, the bipolar transistor 305 comprises an emitter region 307 formed within a base region 309, which in turn, is formed within a collector region 311. The collector region 311 is surrounded by a trench isolation region 315. Via 317, runner segment 319, and overlying via structure 321 connect the emitter region 307 to the $V_{in}$ input voltage terminal 323I. The temperature sensor circuitry 130 also includes a $V_{ss}$ output voltage terminal 323F, a $V^-$ negative voltage sensing terminal 323G, a $V^+$ positive voltage sensing terminal 323H, and a $V_{in}$ input voltage terminal 323I. Via 325, runner segment 327 and overlying via structure 329 also connect the emitter region 307 to the $V^+$ positive voltage sensing terminal 323H. Vias 331 and 333, runner segment 335 and overlying via structure 337 connect the $V^-$ negative voltage sensing terminal 323G to both the base region 309 and the collector region 311 through a collector contact 339, while via 341, runner segment 343 and overlying via structure 345 also connect the $V_{ss}$ output voltage terminal 323F to the collector region 311 through the collector contact 339.

Figure 4:
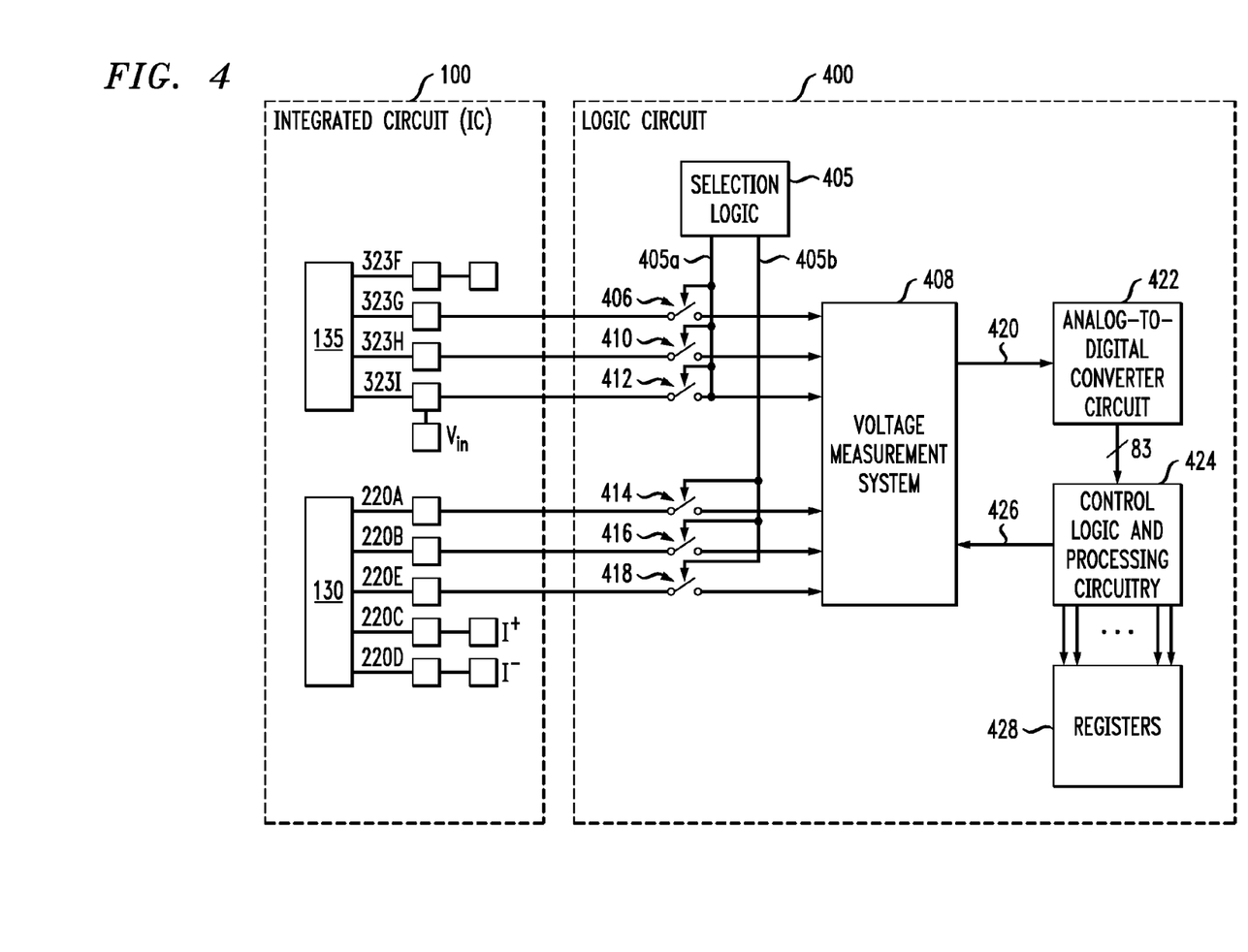
FIG. 4 illustrates monitoring circuitry operable with the test structure.

FIG. 4 illustrates one embodiment of a logic circuit 400 that can be used in conjunction with the test structure 135 for monitoring the IC 100 of FIG. 1. It should be noted that the logic circuit may be any circuit, such as a microprocessor, that is capable of outputting monitoring data or signals generated by the test structure 135. The logic circuit 400 may be incorporated into or form a part of the IC 100, or it may be a separate circuit that is connected to the IC 100. As shown in FIG. 4, $V_{ss}$ output voltage terminal 323F, $V^-$ negative voltage sensing terminal 323G and $V^+$ positive voltage sensing terminal 323H of FIG. 3B, are switched from the multiplexer or selection logic 405, which may be located on an external chip 400, to the IC 100. A switch 406 and select signal line 405a may be used to accomplish the switching operation.

As shown in FIG. 4, the various terminals 323F, 323G, and 323H to which the test structure 135 is connected may be interfaced with the logic circuit 400 containing the multi-wire voltage measurement system 408. When selection logic 405 provides a logic high enable signal along line 405b to switches 406, 410 and 412, the switches 406, 410 and 412 close to connect the bond pads 323F, 323G, and 323H to the voltage measurement system 408. The Vss terminal 323F is permanently wired to the Vss of the IC 100.

The multiplexer or selection logic 405 may also included additional enable lines, which are not shown, in order for the multiplexer circuitry to alternately scan data from other test structures during operation of the IC 100 and from structures monitored on other integrated circuits operating in a system in which the IC 100 is placed. An ESD protection circuitry (not shown) may be connected to the bond pads 220A-220E. The voltage measurement system 408 may be configured to provide all of the data acquired through the enabled lines along a serial path 420 to an analog-to-digital converter circuit 422. Digitized signals are transferred from the converter circuit to control logic and processing circuitry 424, which provides control signals 426 to the multiplexer circuitry 408 and receives the digitized data from the converter circuit 422 to provide an indication as to whether the data acquired from the test structure 130 is indicative of any potential or actual reliability concerns on the IC 100. Current status information and appropriate control signals, e.g., for implementing corrective action, are written to registers 428.

Alternately or in addition to the embodiment just described, the bond pad terminals 220A and 220B to which the test structure 130 is connected may be interfaced with logic circuit 400. The bond pad terminal 220E may also interface with the system 408 to monitor the test structure for operation aberrations or failures. For example, the test structure 130 may be configured as a monitor for monitoring the existence of extrusion-induced shorts due to electromigration. Selection logic 405 provides a logic high enable signal along line 405b to switches 414, 416, and 418. With a logic high signal on line 405b, switches 414, 416, and 418 close to connect the bond pad terminals 220A, 220B and 220E to the voltage measurement system 408. In the embodiment of FIG. 4, the positive and negative current supplies $I^+$ and $I^-$ are shown permanently wired to the terminals 220C and 220D of the IC 100 to continuously stress the electromigration tester when the IC 100 is powered up.

Alternately, current supplies can be provided from the logic circuit 400. The test structure 130 receives continuous electrical stress in order to associate measured data with reliability of the features of concern.

Figure 5A:
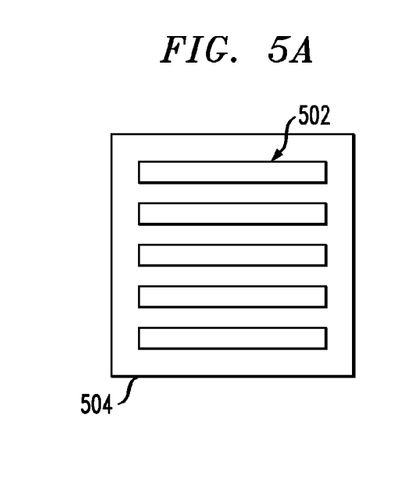
FIGS. 5A-5G illustrate just a few of the various layout configurations of the test structure covered by the invention.
Figure 5B:
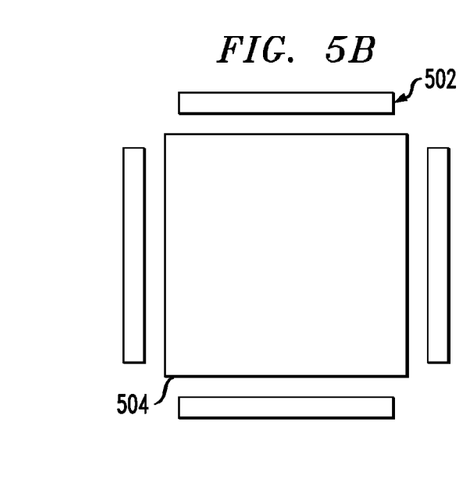
Figure 5C:
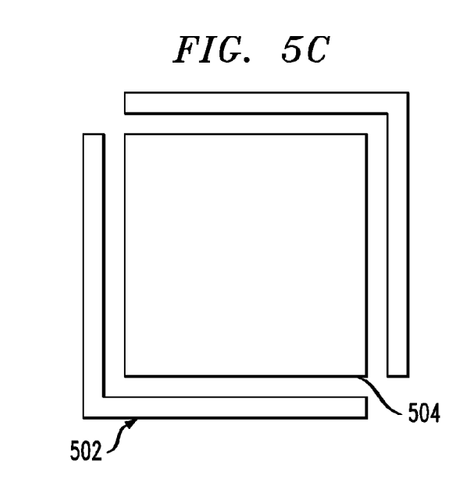
Figure 5D:
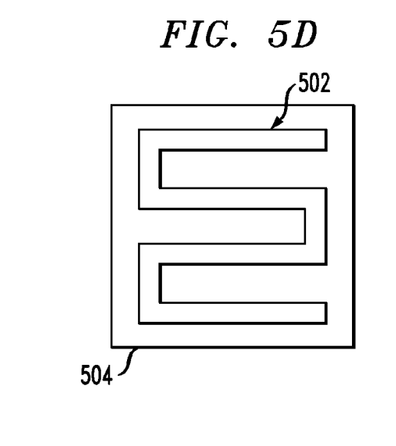
Figure 5E:
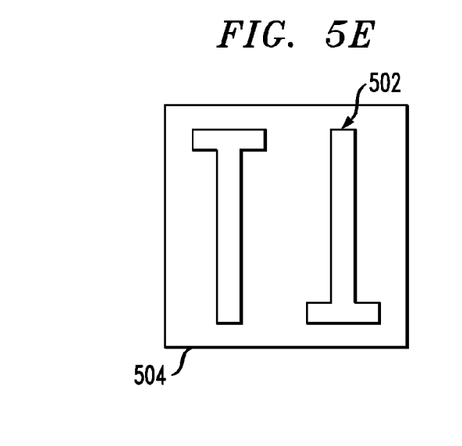
Figure 5F:
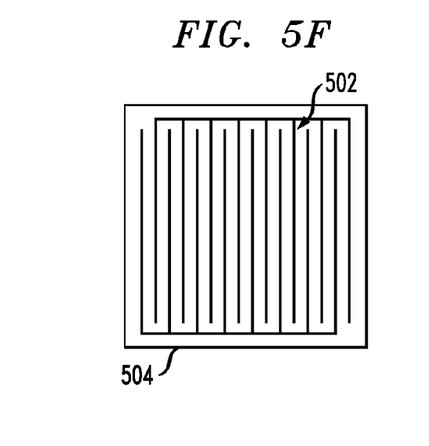
Figure 5G:
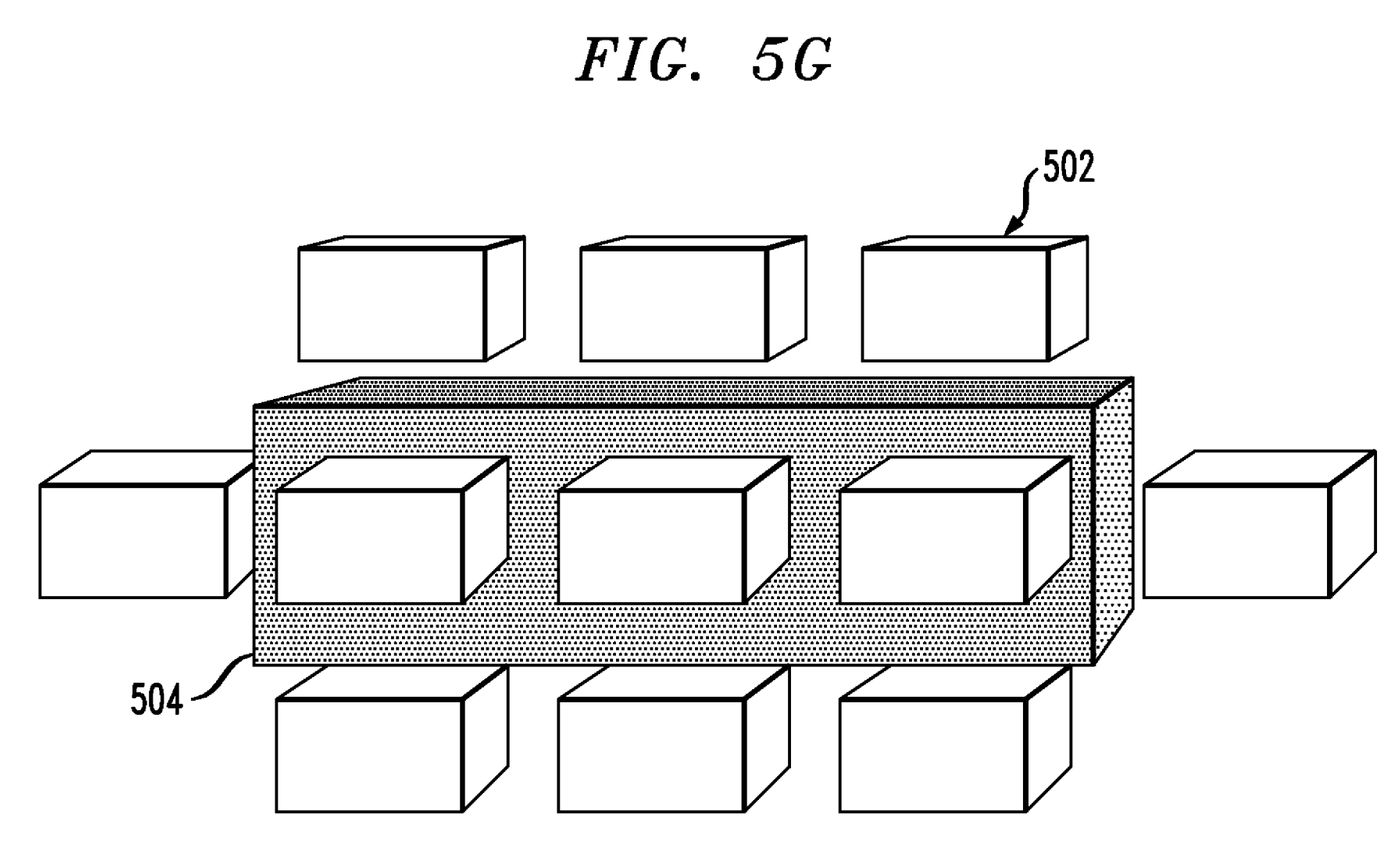

FIGS. 5A-5G illustrate just a few of the various configurations in which the test structure or structures 502 may be arranged, some embodiments of which are discussed above. For example, the test structure 502 may be a plurality of strips located within the perimeter of a localized area 504 of hot-spot 125 (FIG. 1), as shown in FIG. 5A, or they may be located adjacent the localized area 504 as shown in FIG. 5B. In another configuration, the test structures 502 may be longer strips that round the corners of the localized area 504, as shown in FIG. 5C. In yet another embodiment, the test structure 502 may have a serpentine configuration, as shown in FIG. 5D, or they may have a "T"-shaped configuration, as illustrated in FIG. 5E. In yet other embodiments, the test structures 502 may have an inter-digitated comb configuration as show in FIG. 5F or may surround a three dimensional area of the hot-spot 125, as illustrated in FIG. 5G.

As discussed above, these test structures are built into the IC 100 (FIG. 1) to provide real-time monitoring of known hot-spots located within the IC 100. When the test structures of the invention indicate failure or imminent failure of the hot-spot the test structure may be replaced. Replacement may be accomplished in at least two ways. For example, fuses located within the IC 100 may be blown to route current around that hot-spot. Alternatively, the IC 100 may be located on a card that can be easily removed from the device and replaced with a new card.

Thus, as seen from the foregoing, the test structures may be placed within or near enough to a region of reliability concern to be able to continually monitor a parameter associated with that test structure and determine, for example, thermal variation in the region of concern during device operation. For example, in the past, due to thermal noise, temperature monitoring devices such as thermal diodes would only have been placed around the edge regions of IC die to assure minimal noise impact on, for example, rf components. This only provided a general temperature indication of the device without information as to the origin of related thermal stress or the impact of the thermal elevation on device reliability. Heretofore, thermal monitoring devices have not been placed directly in or close enough to regions of thermal concern to monitor thermal dynamics of a specific region. Thus, thermal monitoring has not been used for real-time assessment of reliability based on dynamics in specific circuit regions of an integrated circuit device. This is in part because rf components are known to be very sensitive to noise from nearby circuits. On the other hand, as device integration continues to scale up, sensitivity of these types of regions to thermal failure becomes more critical and less predictable.

Despite sensitivities of rf components to, for example, DC noise, it is now recognized that the value of placing the thermal monitoring devices near regions of potential thermal failure is desirable. Conventional concerns relating to noise interference can be addressed by placing the thermal monitoring devices with sufficient spacing and electrical isolation from the thermally sensitive region to avoid adverse noise effects while the device is placed within sufficient proximity to assess the thermal dynamics of the specific region and model the reliability based on real-time data.

With placement of thermal monitors in or near regions of thermal concern, it is possible to measure thermal gradients and incorporate this information into predictions of thermally sensitive variables such as the rate of electromigration within specific regions.

Temperature gradients within a packaged silicon device can be simulated by a finite element analysis method from device operation conditions and boundary conditions. Device operation conditions include ambient temperature, device operation frequency range, and modes of operation, for example, reading mode or writing mode in the case of devices used in hard disk drives. Boundary conditions include semiconductor substrate material and thickness, package type and material, location of the device on a printed circuit board or in a rack-mounted system, and cooling methods. Alternatively, analytical methods can also provide a reasonable estimate of temperature gradient. Thermal simulation using these tools can be used to identify a feature of concern, i.e., a site of potential thermal reliability concern. The simulation can be also used to determine the temperature difference between the feature of concern and the location selected for placement of reliability testers and to estimate thermal gradient within the reliability tester. Assuming that the reliability tester is placed in a region where the temperature is cooler than the feature of concern, for example, by 5 degrees, the reliability period of the feature in the hot spot is modeled based on the data acquired in the cooler region. Using the temperature gradient information obtained from the simulation, a thermal sensor may be placed at a location near the hot spot to monitor the temperature of the hot spot. The measured temperature is then used to determine the temperature of the feature of concern in combination with the thermal gradient information. A pessimistic temperature assumption leads to costly and sometimes unrealistic thermal guard-bands in the designs, whereas an optimistic temperature assumption leads to underestimation of leakage current of transistors and device power consumption. The combination of thermal gradient information and temperature measurement with thermal sensors can verify the thermal design margin under actual operating conditions.

Exemplary real-time monitoring of device performance indicators has been illustrated. Monitoring may be performed in a variety of different types of circuit regions including phase lock loops, voltage controlled oscillators, high current specialized I/O, clock distribution systems, high activity register file systems and other thermally sensitive circuitry. The test structures may include NBTI testers, soft breakdown testers, high frequency testing ring oscillators and strain gauges. The test structures may be designed with greater sensitivity to thermal effects and transients than the circuit region being monitored so that parameter drifts or adverse effects are observable in one or more of the test structures before the region of interest experiences significant deleterious changes. This approach may be most relevant to the compound effects of smaller feature sizes and higher localized power densities as operating frequencies continue to increase.

The example embodiments enable real-time assessments of critical parameters, such as the reliability margin. That is, parametric values acquired through continual monitoring can be used to more accurately determine cumulative consumption of the reliability margin. By way of example, given a semiconductor product with an expected life of 10 years, if a region of the IC is found to have operated at 100° C. during a first period of time, but through monitoring the same region is then found to sustain a 110° C. operating temperature, the reliability period can be updated based on this field data suggesting, perhaps, that the reliability period has been shortened by 50 percent. By monitoring temperature variations as a function of time, an updated estimate of the reliability period can be had.

Such monitoring also fills in knowledge gaps relating to behavior of products under field conditions. Product evaluations are often performed under accelerated conditions or elevated temperatures. With product designs based on limited tests, and with smaller feature sizes having smaller reliability margins, a need for real-time monitoring of operating conditions is met with the methods provided herein. Real-time measurements made on embedded test structures during field operation of a product provide a more complete understanding of reliability issues.

As other examples, variations in $V_{dd}$ can be detected by voltage sensor circuitry, e.g., by monitoring for changes in the voltage drop across a segment of interconnect, and changes in circuit performance, such as speed and matching, can be assessed. When the associated voltage sensors are placed in conjunction with thermal diodes to monitor the same hot spot regions, the information acquired can help assess the specific influence the temperature variation has on voltage variation and power distribution.

Although the present invention has been described in detail, those skilled in the art should understand that they can make various changes, substitutions and alterations herein without departing from the spirit and scope of the invention in its broadest form.

What is claimed is:

1. A semiconductor device, comprising:
   transistors;
   dielectric layers located over the transistors;
   interconnects formed within the dielectric layers; and
   a test structure located adjacent a hot-spot of the semiconductor device and configured to monitor a real-time operational parameter of at least one of the transistors or interconnects.

2. The device recited in claim 1, wherein a location of the hot-spot is predetermined.

3. The device recited in claim 1, wherein the test structure is located within the dielectric layers adjacent a localized area that includes one or more interconnect structures.

4. The device recited in claim 3, wherein the localized area is defined by a perimeter and the test structure is located within the perimeter.

5. The device recited in claim 4, wherein the test structure has a serpentine configuration, an inter-digitated comb configuration, multiple strips configuration, or T-shaped configuration.

6. The device recited in claim 1, further including a logic circuit that is configured to receive and analyze signals from the test structure.

7. The device recited in claim 1, wherein the device is connected to a logic circuit that is configured to receive and analyze signals from the test structure.

8. The device recited in claim 7, wherein the test structure includes a logic circuit that is configured to output signals.

9. The device recited in claim 1, wherein the test structure is a resistor, thermometer, diode, or reliability tester.

10. The device recited in claim 1, wherein the operational parameter is resistance, frequency, or temperature.

11. A method of manufacturing an integrated circuit, comprising:
    forming transistors over a semiconductor substrate;
    forming dielectric layers over the transistors;
    forming interconnects within the dielectric layers; and
    placing at least one test structure within at least one of the dielectric layers and adjacent a hot-spot associated with an interconnect structure that is susceptible to high temperatures during real-time operation, the at least one test structure configured to monitor a temperature, frequency change, or resistance change of the interconnect structure.

12. The method recited in claim 11, wherein placing the at least one test structure includes placing a test structure adjacent each of a plurality of the interconnect structures.

13. The method recited in claim 12, wherein the hot-spot is within a localized area of the interconnect structure and placing includes placing the test structure within a perimeter of the localized area.

14. The method recited in claim 11, wherein placing includes placing a test structure that has a serpentine configuration, an inter-digitated comb configuration, multiple strips configuration, or T-shaped configuration.

15. The method recited in claim 11, further including connecting the test structure to a logic circuit that is configured to receive and analyze signals from the test structure.

16. The method recited in claim 11, further including forming a logic circuit within the semiconductor device that is configured to receive and analyze signals from the test structure, the logic circuit being connectable to an external display device.

17. The method recited in claim 11, wherein the test structure is a resistor, thermometer, diode, or reliability tester.

18. A method of monitoring an integrated circuit, comprising:
    monitoring a test circuit located adjacent a hot-spot of the integrated circuit during real-time operation of the integrated circuit, the test circuit configured to produce a signal in response to a change in an operational parameter of at least one of a transistor or interconnect structure of the integrated circuit;
    analyzing the signal to determine if a failure within the hot-spot has occurred or prospective failure will occur within a predetermined period of time; and
    replacing the integrated circuit when the signal indicates the failure or prospective failure.

19. The method recited in claim 18, wherein analyzing includes transmitting the signal from the test circuit to a logic circuit that is connected to a display.

20. The method recited in claim 18, wherein analyzing includes analyzing a change in resistance, frequency, or a temperature of the hot-spot.

* * * * *